(12) United States Patent
Maeda et al.

(10) Patent No.: US 8,138,428 B2
(45) Date of Patent: Mar. 20, 2012

(54) LEAD-EMBEDDED METALLIZED CERAMICS SUBSTRATE AND PACKAGE

(75) Inventors: Masakatsu Maeda, Yamaguchi (JP); Yasuyuki Yamamoto, Yamaguchi (JP)

(73) Assignee: Tokuyama Corporation, Yamaguchi (JP)

( * ) Notice: Subject to any disclaimer, the term of this patent is extended or adjusted under 35 U.S.C. 154(b) by 751 days.

(21) Appl. No.: 12/279,073

(22) PCT Filed: Feb. 7, 2007

(86) PCT No.: PCT/JP2007/052146
§ 371 (c)(1), (2), (4) Date: Oct. 28, 2008

(87) PCT Pub. No.: WO2007/094221
PCT Pub. Date: Aug. 23, 2007

(65) Prior Publication Data
US 2010/0000768 A1    Jan. 7, 2010

(30) Foreign Application Priority Data
Feb. 16, 2006  (JP) .................................. 2006-039997

(51) Int. Cl.
*H05K 1/11* (2006.01)
(52) U.S. Cl. ............................ 174/262; 174/255; 29/837
(58) Field of Classification Search ........................ None
See application file for complete search history.

(56) References Cited

U.S. PATENT DOCUMENTS

| | | | | |
|---|---|---|---|---|
| 4,551,789 A | * | 11/1985 | Schettler et al. | 361/774 |
| 4,871,583 A | * | 10/1989 | Monnier | 29/852 |
| 5,006,922 A | * | 4/1991 | McShane et al. | 257/697 |
| 6,903,278 B2 | * | 6/2005 | Sathe | 174/255 |

FOREIGN PATENT DOCUMENTS

| | | |
|---|---|---|
| JP | 05-226513 | 9/1993 |
| JP | 06-53398 | 2/1994 |
| JP | 06-69567 | 3/1994 |
| JP | 06-77361 | 3/1994 |
| JP | 2000-114418 | 4/2000 |
| JP | 2000-200858 | 7/2000 |
| JP | 2002-252461 | 9/2002 |

OTHER PUBLICATIONS

International Search Report; PCT/JP2007/052146.

* cited by examiner

*Primary Examiner* — Ishwarbhai Patel
(74) *Attorney, Agent, or Firm* — Ladas & Parry LLP

(57) ABSTRACT

A metallized ceramics substrate including: a ceramics body; a wiring pattern formed on one surface of the ceramics body; and a lead electrically-connected to the wiring pattern. The ceramics body has a through-hole, the lead penetrates the through-hole and sticks out from another surface of the ceramics body, and the lead is fixed by filling an electroconductive filler between the lead and the through-hole for keeping airtightness. The metallized ceramics substrate does not cause a problem of interlayer peeling and is excellent in airtightness and electric conductivity.

7 Claims, 2 Drawing Sheets

LEAD-EMBEDDED METALLIZED CERAMICS SUBSTRATE AND PACKAGE

TECHNICAL FIELD

The present invention relates to a lead-embedded metallized ceramics substrate for mounting semiconductor device and a package constituted by the metallized ceramics substrate.

BACKGROUND ART

A metallized substrate for mounting semiconductor devices is formed to become an electronic component like light-emitting element by mounting, e.g., LD elements or LED elements on a substrate, and by sealing the upper portion of the substrate with a lid such as lens. At this circumstance, so as to secure long-term reliability and to protect embedded elements, it is necessary to completely shut off outside of the electronic component from inside of the same. Because of this, the metallized ceramics substrate is required to have high airtightness.

With developments in high integration of electronic components, wiring pattern and vias in the metallized substrate become miniaturized; so, electrical signals transmitted along wiring sometimes are delayed. Because of this, formation of low-resistant and highly-reliable wiring in a metallized substrate is demanded.

With respect to the technology of metallized substrate for mounting semiconductor device thereon, Patent document 1 discloses a plastic PGA-type package having a structure in which lead frame and copper foil are laminated so as to sandwich insulator, in which a cavity is formed to mount a semiconductor tip, and to which lead pins are inserted.

Patent document 2 discloses a ceramics PGA package fabricated by integrally firing a laminated body formed of a plurality of green sheets and the wiring patterns existing between the respective green sheets.

Patent document 3 discloses a laminated ceramics package which is formed by integrally laminating a plurality of ceramics layers, wherein metal layers are independently arranged to be electrically non-conductive, between ceramics layers being underneath a cavity. In addition, Patent document 4 discloses a multi-tip module including a multilayered wiring substrate on one surface of which is provided with electrode pads for connecting LSI tip and on another surface of which is provided with input terminals for connecting external circuit, a plurality of LSI tips, and a heat sink.

Patent Document 1: Japanese Patent Application Laid-Open (JP-A) No. 5-226513
Patent document 2: JP-A No. 6-53398
Patent document 3: JP-A No. 6-69567
Patent document 4: JP-A No. 6-77361

DISCLOSURE OF THE INVENTION

Problems to be solved by the Invention

However, as the invention of Patent document 1 uses plastic as an insulator, there is a problem of airtightness; further, since it is configured by a multilayered structure, there is a possibility of interlayer peeling.

In addition, the invention in Patent document 2 has a multilayered structure including a plurality of ceramics layers and metal-wiring layers; therefore, due to the difference of the shrinkage ratio between them at a time of firing, crack or interlayer peeling is caused, those sometimes result in the problem of airtightness. Moreover, as it has a structure of which through-hole is filled with conductive material (for example, tungsten paste), cracks are developed in the through-hole at a time of firing and a problem of airtightness is sometimes caused. Also, as it has a structure wherein sintered body is provided as a conductive material in the through-hole, existence of voids in the sintered body and of ceramics component added as a co-material possibly results in deterioration of electric conducting property.

Furthermore, Patent document 3 does not disclose electrical connection structure with semiconductor device to be mounted at all. And, Patent document 4 does not disclose any connection structure with electrode pads and input terminal, either. Thus, these documents show no consideration for a problem of airtightness which is possibly caused at portions of electrical connection structure of the metallized ceramics substrate.

Accordingly, an object of the present invention is to fabricate a metallized ceramics substrate which has no problem of interlayer peeling and is excellent in airtightness as well as electric conducting property, so as to solve the above problems.

Means for Solving the Problems

Hereinafter, the invention will be described. In order to make the understanding of the present invention easier, reference numerals of the attached drawings are quoted in brackets; however, the present invention is not limited by the embodiment shown in the drawings.

The first aspect of the present invention is a metallized ceramics substrate (100) comprising: a ceramics body (10); a wiring pattern (20) formed on one surface of the ceramics body; and a lead (30) electrically-connected to the wiring pattern (20), wherein the ceramics body (10) has a through-hole (40), the lead (30) penetrates the through-hole (40) and sticks out from another surface of the ceramics body (10), and the lead (30) is fixed by filling an electroconductive filler (50) between the lead (30) and the through-hole (40) for keeping airtightness.

In the first aspect of the invention, the lead (30) is preferably a metal pin, wherein the metal pin, preferably, connects to the wiring pattern (20) in one end thereof and penetrates the through-hole (40), and another end of the metal pin sticks out from another surface of the ceramics body. In addition, a hook portion is preferably formed in one end of the metal pin for preventing its dropping out.

In the first aspect of the invention, electroconductive filler (50) is preferably a brazing alloy.

In the first aspect of the invention, the wiring pattern is preferably a triple-layer structure comprising: a lower layer (22); a middle layer (24); and a upper layer (26), wherein the lower layer (22) is formed by coating a conductive paste containing ceramics powder, the middle layer (24) is formed by coating a conductive paste which does not contain ceramics powder, and the upper layer (26) is a plated layer.

In the first aspect of the invention, an outflow prevention member (60) is preferably convexly formed, for limiting area to be filled by the electroconductive filler (50), on the wiring pattern (20) formed on one surface of the ceramics body (10). The outflow prevention member (60) may be made of ceramics or metal; with the proviso that if it is made of metal, the member should not be easily deformed at a time of filling the electroconductive filler (e.g. if the electroconductive filler is made of brazing alloy, the member must be a metal having higher melting point than that of the brazing alloy).

Moreover, in the first aspect of the invention, semiconductor device (80) such as LD and LED is usually placed on the wiring pattern (20), so as to enhance the reliability of the semiconductor device (80), it is preferable to cover the semiconductor device with a lid member (90). The metallized ceramics substrate of the first aspect of the invention preferably has a metal frame (70) for joining the lid member (90) to the ceramics substrate (10) for keeping airtightness. The metal frame (70) preferably comprises a metallized pattern being electrically-insulated with the wiring pattern and being configured to encircle the wiring pattern (20) is provided on one surface of the ceramics body on which the wiring pattern (20) are formed. On the connecting surface of the lid member (90), a metal part (92) is normally formed. The metal part (92) and the metal frame (70) are connected each other using solder, brazing alloy, and so on.

The second aspect of the present invention is a method for fabricating metallized ceramics substrate (100) comprising the steps of: forming through-hole (40) in a ceramics body (10); forming a wiring pattern (20) on one surface of the ceramics body (10) by coating a conductive paste and firing thereof; inserting the lead (30) into the through-hole (40), connecting one end of the lead (30) to the wiring pattern (20), and sticking another end of the lead out from another surface of the ceramics body (10) to make it work as an external terminal; and filling a filler (50) air-tightly in a gap between the lead (30) and said through-hole (40).

The third aspect of the present invention is a package (200) for incorporating a semiconductor device having a metallized ceramics substrate (100) of the first aspect of the invention, as a constitutional element, wherein the metallized ceramics substrate comprising the metal frame (70) comprising the metallized pattern being electrically-insulated with the wiring pattern and being configured to encircle the wiring pattern on one surface of the ceramics body where the lead and the electrically-connected wiring pattern are formed.

Effects of the Invention

According to the first aspect of the present invention, since it is a monolayer ceramics substrate, no interlayer peeling is caused, therefore it is excellent in airtightness. Moreover, as it has a structure such that the lead (30) penetrates the through-hole (40) and directly connects to the wiring pattern (20), it exhibits high electroconductivity. Further, large part of the internal space of the through-hole (40) is occupied with lead, and a space between sidewall of the through-hole and the lead is filled with an electroconductive filler (50) such as brazing alloy for keeping airtightness; thereby there is no problem of airtightness caused by cracks.

Figure 1:
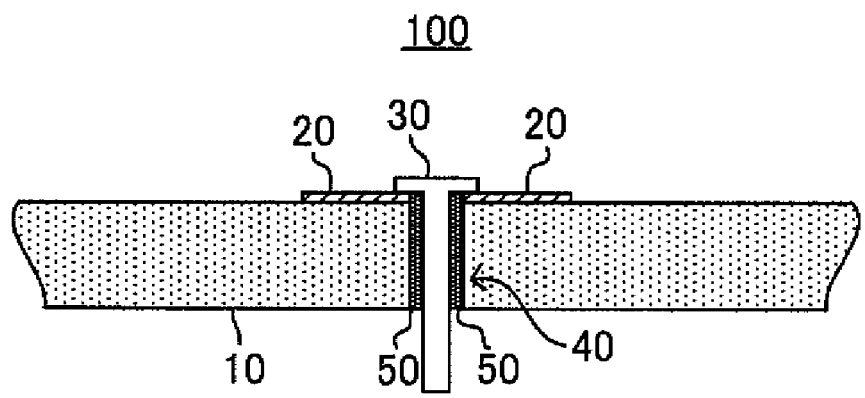
FIG. 1 is a side cross sectional view showing a metallized ceramics substrate 100 of the present invention.

DESCRIPTION OF THE REFERENCE NUMERALS 10 ceramics substrate
20 wiring pattern
30 lead
40 through-hole
50 electroconductive filler
60 outflow prevention member
70 metal frame
80 semiconductor device
90 lid member
100 metallized ceramics substrate
200 package

BEST MODE FOR CARRYING OUT THE INVENTION

Hereinafter, the present invention will be described in detail by way of the following embodiments shown in the drawings.

FIG. 1 is a side cross sectional view showing an embodiment of a metallized ceramics substrate 100 of the invention. The metallized ceramics substrate 100 of the invention comprises a ceramics body 10, a wiring pattern 20 formed on one surface of the ceramics body 10, a lead 30 electrically-connected to the wiring pattern 20. In the ceramics body 10, a through-hole 40 is formed. The lead 30 penetrates the through-hole 40 and sticks out from another surface of the ceramics body 10. Then, an electroconductive filler 50 is filled between the lead 30 and the through-hole 40 to keep airtightness at the area of through-hole and to fix the lead 30.

<Ceramics Body 10>

As the ceramics body 10 used in the present invention, a substrate comprising a known ceramics may be preferably used without any restriction.

Examples of ceramics as a constituent material of ceramics body 10 include: (i) oxide ceramics such as aluminum oxide ceramics, silicon oxide ceramics, calcium oxide ceramics, and magnesium oxide ceramics; (ii) nitride ceramics such as aluminum nitride ceramics, silicon nitride ceramics, and boron nitride ceramics; (iii) beryllium oxide, silicon carbide, mullite, and borosilicate glass. Among them, (ii) nitride ceramics is preferable; especially, aluminum nitride ceramics is preferably used in view of high thermal conductivity.

As a ceramics body 10 used in the invention, for reasons of availability and feature to easily obtain a desired shape, a ceramics body 10 comprising a sintered body configured with ceramics particles of which average diameter is 0.5 to 20 μm, more preferably 1 to 15 μm, may be suitably used. Such a ceramics body 10 can be obtained by firing a green sheet constituted by a ceramics raw material powder of which average particle diameter is 0.1 to 15 μm, preferably 0.5 to 5 μm.

In the green sheet for fabricating the ceramics body 10, sintering aids, organic binder, and so on may be contained. As sintering aids, depending on the kind of ceramics raw material powder, commonly-used sintering aids may be used without restriction. In addition, examples of organic binder include polyvinyl butyral, ethylcelluloses, and acrylic resins; so as to make formability of the green sheet favorable, poly-n-butyl methacrylate and polyvinyl butyral are particularly preferably used.

As a green sheet for obtaining the ceramics body 10 of the invention, in view of heat conductance of the obtained ceramics body 10, a green sheet for nitride ceramics formed by using a nitride ceramics powder (containing a sintering aids) as the ceramics raw material powder may be used; particularly, a green sheet for aluminum nitride formed by using aluminum nitride powder (containing a sintering aids (for example, yttrium oxide or calcium oxide)) as the raw material powder may be suitably used.

Size of the ceramics body 10 is not specifically restricted; it may be suitably determined depending on the purpose.

Meanwhile, thickness of the substrate for mounting semiconductor devices, in general, is about 0.1 to 2 mm, preferably 0.2 to 1 mm.

The ceramics body 10 is formed with a through-hole 40. The through-hole 40 is made by mechanically piercing a plain green sheet using a pin; then, by degreasing and firing; finally, a through-holed substrate is fabricated. Or, the through-holed substrate is fabricated by firstly degreasing and firing the green sheet, and then, piercing the ceramics body 10 using laser or mechanical drill. The through-hole 40 obtained by piercing a sintered body may be formed after forming the below-described wiring pattern 20; or, it may be obtained by firstly forming the through-hole 40 in the ceramics body 10, then forming the wiring pattern 20, the order is not specified. However, as described below, in the method for fabricating a preferable embodiment of the metallized ceramics substrate 100 shown in FIG. 2, it is necessary to form a wiring pattern 20 inside the through-hole 40, the through-hole 40 needs to be formed prior to the making of the wiring pattern 20.

Shape and size of the through-hole 40 is not specifically restricted as long as it is large enough for the lead to pass through; in view of ease of workability, if the cross-section of the through-hole is circle, the diameter is preferably 0.2 to 3.0 mm. On the other hand, if the cross-section of the through-hole is rectangle, due to the same reason as above, preferably, width of the cross-section is 0.2 to 3.0 mm and length of the same is 0.2 to 10 mm.

In general, as for ceramics via substrate (ceramics substrate having at least a through-hole (via hole) in which a conducting substance is filled), a via hole which is filled with metal sintered body is made by filling a conductive paste in the through-hole and firing it. At this stage, since entire inside of the through-hole is filled with the conductive paste, shrinkage of the paste in the radial direction (a direction extending from the center of the hole to the outer circumference) at a time of firing is restricted. Therefore, the ceramics via substrate cannot bear stress generated at a time of sintering; thereby, it cannot avoid production of cracks and voids inside the sintered body. As a result, conductivity of the via hole is lowered. Meanwhile, so as to make the paste adaptable with the substrate, it is said that it is preferable to make the conductive paste contain a ceramics particle. However, as ceramics component being insulator is contained in the paste, conductivity of the via hole is also lowered. Further, because of the difference between shrinkage ratio of the conductive paste and that of substrate at a time of firing, cracks may be possibly produced in the via hole.

In this way, in an embodiment in which through-hole is filled with a conductive paste and then fired with the paste, there is a possibility that problems related to conductivity and airtightness are caused. In the invention, without filling a conductive paste into the entire through-hole, the lead 30 is made directly connect to the wiring pattern 20 existing on the surface of the ceramics body 10; the lead 30 is made penetrate the through-hole 40 to stick out from back surface of the ceramics body; and the electroconductive filler 50 (such as brazing alloy which inhibits production of cracks and voids inside the through-hole) is filled in the space between sidewall of the through-hole and the lead for keeping airtightness, so as to solve the above problems related to airtightness and conductivity.

In the invention, a metallized layer may be formed using a conductive paste on the inner surface of the through-hole, wherein the conductive paste is thinly coated on the inner surface (being not filled with the entire internal space of the through-hole); thereby the paste is shrinkable in the thickness direction at a time of firing, consequently, cracks and voids are not caused inside the through hole.

The metallized ceramics substrate 100 of the invention may be formed by the so-called "post-firing method" comprising the steps of: firing a green sheet to make a sintered body; and then coating the below-described conductive paste thereon to form the wiring pattern 20. The metallized ceramics substrate 100 may also be formed by the so-called "co-firing method" comprising the steps of: firstly coating the conductive paste on the green sheet; and then firing the green sheet and conductive paste simultaneously. In general, this kind of metallized substrate is made by forming a plurality of patterns on a large size of substrate, then dividing and cutting the substrate. So, from the view point of precision of pattern's alignment, the post-firing method is more preferably adopted. In the post-firing method, the conductive paste is directly coated on the sintered body, then the paste and the sintered body are fired together; shrinkage of the conductive paste layer in the crosswise direction is restricted by the sintered body. Thereby, the wiring pattern 20 to be formed can be made with a high degree of precision and fineness.

<Wiring Pattern 20>

The wiring pattern 20 can be formed by coating the conductive paste in desired areas on the ceramics body 10. As a conductive paste for forming the wiring pattern 20, a known conductive paste containing components such as: metallic powder, organic binder, organic solvent, dispersant, and plasticizer, may be used without any restriction.

Examples of metallic powder contained in the conductive paste include: a metallic powder such as tungsten, molybdenum, gold, silver, and copper; among them, it is preferable to use a powder of high-melting-point metals having heat resistance to high temperature at a time of firing. From the viewpoint of adhesiveness, the metallic powder is preferably tungsten and/or molybdenum; in view of electric conductivity and cost, tungsten is most preferable. Average particle diameter of the metallic powder contained in the conductive paste is preferably 0.1 μm or more and 6 μm or less. In view of mounting a semiconductor device on the formed wiring pattern 20, the surface roughness of the wiring pattern 20 is preferably small; therefore, the average particle diameter is more preferably less than 3 μm, and furthermore preferably less than 2.5 μm. It should be noted that in the present invention, average particle diameter of the metallic powder is determined using Air-Permeability Method with "Sub Sieve Sizer" manufactured by Fisher Scientific Company.

As an organic binder contained in the conductive paste, known one may be used without any restriction. Examples thereof includes: acrylic resin such as polyacrylic acid ester and polymethacrylic acid ester; cellulose series resin such as methylcellulose, hydroxy methylcellulose, nitrocellulose, and cellulose-acetate-butyrate; vinyl-containing resin such as polyvinyl butyral, polyvinyl alcohol, and polyvinyl chloride; hydrocarbon resin such as polyolefin; and oxygen-containing resin such as polyethyleneoxide. These may be used alone or in combination with two or more thereof.

As an organic solvent contained in the conductive paste, known one may be used without any restriction. Examples thereof includes: toluene, ethyl acetate, terpineol, butylcarbitol acetate, and texanol. More preferably, a solvent which dissolves the above organic binders well may be selected.

As a dispersant contained in the conductive paste, known one may be used without any restriction. Examples thereof includes: phosphoester and polycarboxylic acid dispersants.

As a plasticizer contained in the conductive paste, known one may be used without any restriction. For example, dioctyl phthalate, dibutyl phthalate, diisononyl phthalate, diisodecyl phthalate, and dioctyl adipate, may be used.

To the conductive paste, as an inorganic component other than metallic powder, a ceramics powder constituting the above ceramics body 10 is preferably added; moreover, it is preferable to add a sintering aids for sintering this ceramics powder. Consequently, post-sintering adhesiveness between the sintered wiring pattern 20 and ceramics body 10 can be enhanced, which makes it possible to keep airtightness for a long time. As sintering aids, depending on the ceramics powder, one normally used as sintering aids may be used without any restriction. For instance, when the ceramics is aluminum nitride, rare-earth oxide such as yttrium oxide, alkaline earth metal oxide such as calcium oxide, may be used.

Composition of the conductive paste is not specifically different from that of the conventional conductive paste. It is normally: to 100 parts by mass of metallic powder, a total of 5 to 80 parts by mass of organic component containing organic binder, organic solvent, dispersant, plasticizer, and so on; and a total of 0 to 80 parts by mass of inorganic component such as ceramics powder and sintering aids. Preparation of paste may be done by adequately kneading each component using kneading machine like a triple-roll mill or a planetary mixer.

For example, by post-firing method, when fabricating the metallized ceramics substrate 100 of the invention, the conductive paste thus prepared is coated in the predetermined areas on the surface of the ceramics body 10 formed by firing the green sheet. The invention is the one characterized in the wiring pattern 20 in the vicinity of the through-hole 40 of the ceramics body 10 having a through-hole 40, so the wiring pattern 20 must be formed in the vicinity of the through-hole 40.

Figure 2:
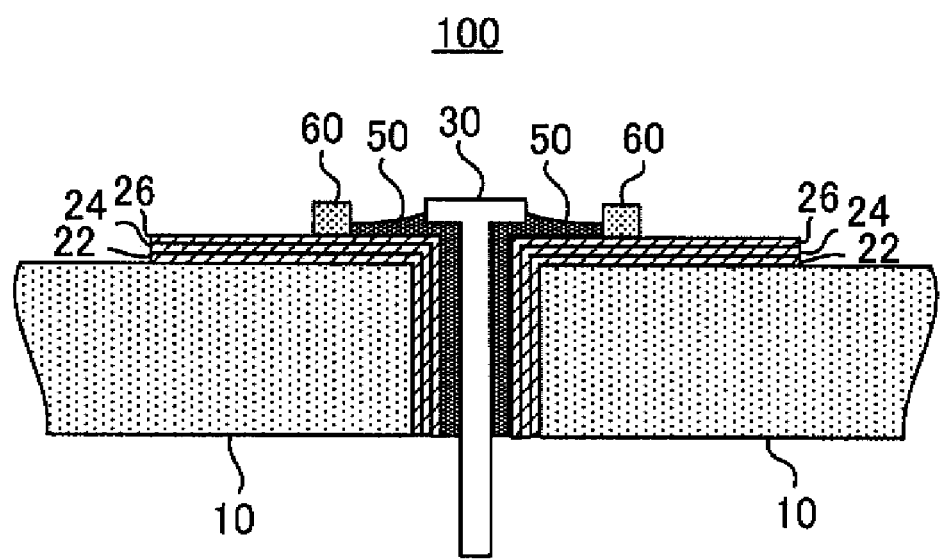
FIG. 2 is a side cross sectional view showing a preferable embodiment of the metallized ceramics substrate 100 of the invention.

FIG. 2 illustrates an enlarged cross sectional view about through-hole 40 portion of a preferable embodiment of the metallized ceramics substrate 100 of the invention. As shown in FIG. 2, wiring pattern 20 may be a triple-layer structure comprising: a first wiring pattern 22 formed by coating a conductive paste containing ceramics powder; a second wiring pattern 24 formed by coating a conductive paste which does not contain ceramics powder; and a plated layer 26.

By forming, between the ceramics body 10 and the second wiring pattern 24, the first wiring pattern 22 using a conductive paste containing ceramics powder, it is capable to enhance adhesiveness between the ceramics body 10, the first wiring pattern 22, and the second wiring pattern 24; thereby it is possible to impart high airtightness to the metallized ceramics substrate 100 of the invention. Moreover, since the second wiring pattern 24 does not contain any ceramics component, it is possible to develop a favorable adhesiveness with the plated layer 26 formed thereon. Further, by providing a plated layer 26 on the surface of the second wiring pattern 24, when using a brazing alloy as a filler 50, it is possible to improve wettability with the brazing alloy. Therefore, it becomes easier to pore the brazing alloy into the gap between the lead 30 and the plated layer 26.

Coating of the conductive paste may be done by known methods such as screen printing, calendar printing, and pad printing. Thickness of the conductive paste layer to be formed is not particularly restricted. In view of lowering resistance, it is preferably 1 μm or more, more preferably 5 μm or more before firing and after drying; also in view of securement of airtightness, it is preferably 50 μm or less, more preferably 30 μm or less before firing and after drying. This is because, if thickness of the conductive paste layer becomes thicker, densification of the conductive paste becomes difficult.

On the other hand, when the thickness has to be secured, for example, means like recoating by using printing method may be possible. In that case, it is also possible to change the component of conductive paste coated on the ceramics body 10 and of the paste coated on the conductive paste. As a configuration of this type of conductive paste other than the above-described triple-layer structure, for instance, by using a material much containing ceramics powder and sintering aids as a conductive paste for forming the lower layer and by using another material less containing ceramics powder and sintering aids as another conductive paste for forming the upper layer, it is possible to form a concentration gradient of the ceramics component in the thickness direction of the eventually formed wiring pattern 20. In addition, it is also possible to partly make this kind of concentration gradient.

Moreover, as above, when the conductive paste for forming a wiring pattern 20 is recoated, it is preferable to dry the conductive paste of primary layer before coating the next layer of conductive paste thereon. By evaporating and removing solvent contained in the primarily formed conductive paste layer, absorption of the solvent in the conductive paste of the secondary formed layer becomes easier, which raise the effect for preventing flow and bleed of the conductive paste. Drying of the conductive paste can be suitably carried out by holding a substrate in the air at a temperature of 40 to 150° C. for 1 to 30 minutes.

<Lead 30>

The lead 30 is electrically-connected to the wiring pattern 20 formed on one surface of the ceramics body 10, penetrates the through-hole 40 formed in the ceramics body 10, and sticks out from another surface of the ceramics body 10; wherein the portion stuck out from the another surface of the ceramics body can be used as external terminals and so on. If the lead has this function, the shape and the like are not particularly restricted.

As a material for forming the lead 30, conductive material is fine. Specifically, a conductive material of which thermal expansion coefficient is closer to that of ceramics substrate is preferable, since stress at a time of below-described brazing becomes smaller. Specifically, kovar being an alloy of iron, nickel, and cobalt, and 42-alloy being an alloy of iron and nickel are preferably used. Specific resistance of these alloys is higher than that of tungsten and molybdenum. However, compared with a general via hole formed by filling the paste of high-melting-point metals such as tungsten and molybdenum into the through-hole and then sintering thereof, a case using these alloys is capable to obtain higher electroconductivity. This is because, it is possible to use an extremely low-resistant material like brazing alloy as an electroconductive filler 50 for filling the space between the lead and the through-hole; meanwhile, in the above-mentioned general via hole, not only ceramics materials are contained in the conductive layer, but also defection like cracks and voids tend to be caused in the conductive layer. Preferable embodiment of the lead 30 may be a bar-shaped metal pin or a plate-like metal pin, wherein the metal pin is connected to the wiring pattern 20 in one end thereof and penetrates the through-hole 40, and another end thereof sticks out from another surface of the ceramics body so as to be an external terminal.

Further, the lead 30, as seen from FIGS. 1 and 2, preferably has a shape in which an end of the pin is extended to form a hook portion for preventing itself coming off from the through-hole. By adopting such a shape, when fabricating the metallized ceramics substrate 100 of the invention, it is possible to inhibit the lead 30 coming off from the through-hole 40. Shape of the hook portion may be flat-plate circular form, or flat-plate quadrangle; the shape is not particularly restricted as long as the size of the hook portion is larger than inner diameter of the through-hole 40 and the hook portion itself functions as a hook. Nevertheless, the shape of the hook portion is preferably flat-plate, in view of preventing convex prominence of the electrodes when used as an electrode for mounting elements.

Electroconductive Filler 50

As the electroconductive filler 50 to be used in the present invention, it is not specifically restricted as long as it is possible to attain airtightness by filling the gap between the lead 30 and the through-hole 40 and also possible to fix the lead 30. Moreover, since the electroconductive filler 50 electrically connects between the lead 30 and the wiring pattern 20, it must have high electroconductivity. Examples of such an electroconductive filler 50 may include: a brazing alloy, a silver solder being an alloy comprising silver and copper, a material obtained by adding indium to the silver solder, or low-melting-point solder including tin-silver-cooper, gold-tin solder, and son on. When the brazing alloy is filled, in order to improve wettability of the brazing alloy, it is preferable to form a metal layer on the inner surface of the through-hole, in advance. This metal layer is formed by using a phenomenon of conductive paste casting along the inner wall of the through-hole when coating the conductive paste in the process for forming the wiring pattern 20. At a time of casting, suction may be done from the opposite surface to the face where the conductive paste is coated. By doing this, it is possible to coat the conductive paste on the inner wall of the through-hole in almost even thickness without filling the through-hole with the conductive paste. As described above, since the metal layer formed on the inner wall of the through-hole is formed simultaneously with the formation of the wiring pattern 20, thus, even if this metal layer and another metal layer to be formed on the surface of the substrate may be regarded as integrated and treated as the wiring pattern 20, there is no problem. On the surface of the metal layer to be formed on the inner wall of the through-hole, it is further preferable to provide electrolytic or electroless plating. Plating can be adequately selected depending on the type of brazing alloy; in general, it is preferable to provide plating of Ni, Cu, Ag, Au, Pt, Rh, and so on in a form of monolayer or plural layers. Moreover, if necessary, it is possible to coat flux on the surface of the metal layer coated on the inner wall of the through-hole and the surface of lead 30.

Further, in order to prevent problems such as disconnection because the electroconductive filler 50 spreads over the wiring pattern 20 and thereby wire bonding cannot be made on the wiring pattern, an outflow prevention member 60 is preferably convexly formed on a predetermined area of the wiring pattern 20, for preventing the flow of electroconductive filler 50 and limiting area to be filled by the filler. The outflow prevention member 60 can be formed by, e.g., firing a ceramics paste layer formed by coating a ceramics paste on the wiring pattern 20. As a method of forming, it may be co-firing method, wherein a green sheet for forming the ceramics body 10 and a conductive paste layer formed thereon are simultaneously fired; it may also be post-firing method, wherein a conductive paste layer and a ceramics paste layer are formed on the surface of the ceramics body 10 formed by firing, and these layers are fired together with the ceramics body 10. As a ceramics paste, a general ceramics paste comprising same components as to form ceramics body 10 such as ceramics powder, sintering aids, organic binder, organic solvent, dispersant, and plasticizer may be used. Coating of the paste is done by known methods like screen printing or calendar printing so that it is preferable to adjust viscosity of the paste to 1 to 500 Pa·s at 25° C.

Forming area of the outflow prevention member 60 is not specifically restricted; it is provided in an area where the flow of electroconductive filler 50 is wished to be prevented. As for an embodiment shown in FIG. 3(*b*), the outflow prevention member 60*a* is formed in the semiconductor device mounting position 84 (it is shown as a dotted line in FIG. 3(*b*).) on the upper portion of the wiring pattern 20*a*, for preventing flow of the electroconductive filler 50 and securing the semiconductor mounting position 80. Moreover, since a bonding wire 82 is connected to the upper portion of the wiring pattern 20*b*, so as to secure the connecting area of the bonding wire 82, the upper portion of the wiring pattern 20*b* is also provided with an outflow prevention member 60*b*.

In addition, height of the outflow prevention member 60 is not specifically restricted; so as to prevent the flow of electroconductive filler 50, it is preferably set to 5 to 50 μm, more preferably 10 to 30 μm. The height in these ranges is effective for preventing the flow.

<Package 200>

Figure 3:
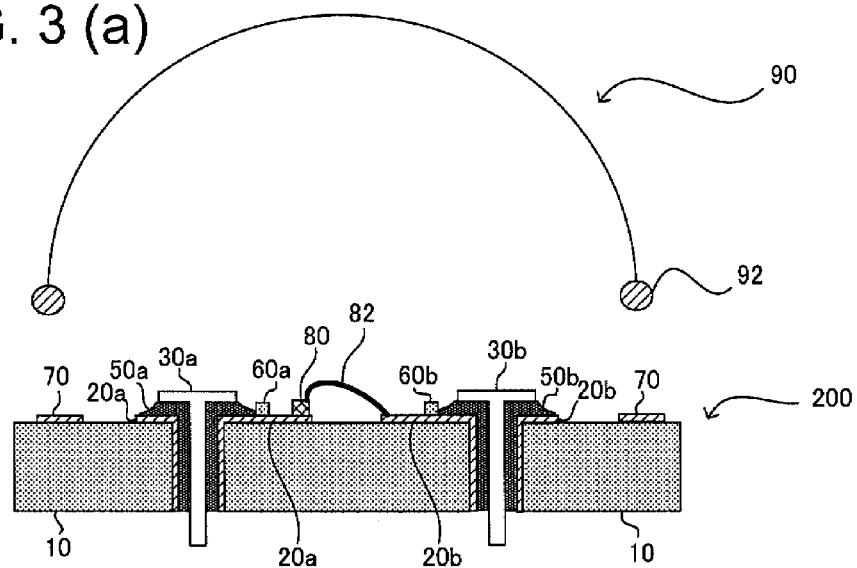
FIG. 3(a) is a side cross sectional view of a package 200 of the invention taken along the line A-A' of FIG. 3(b)
FIG. 3(b) is a plan view showing a package 200 of the invention.
Figure 3:
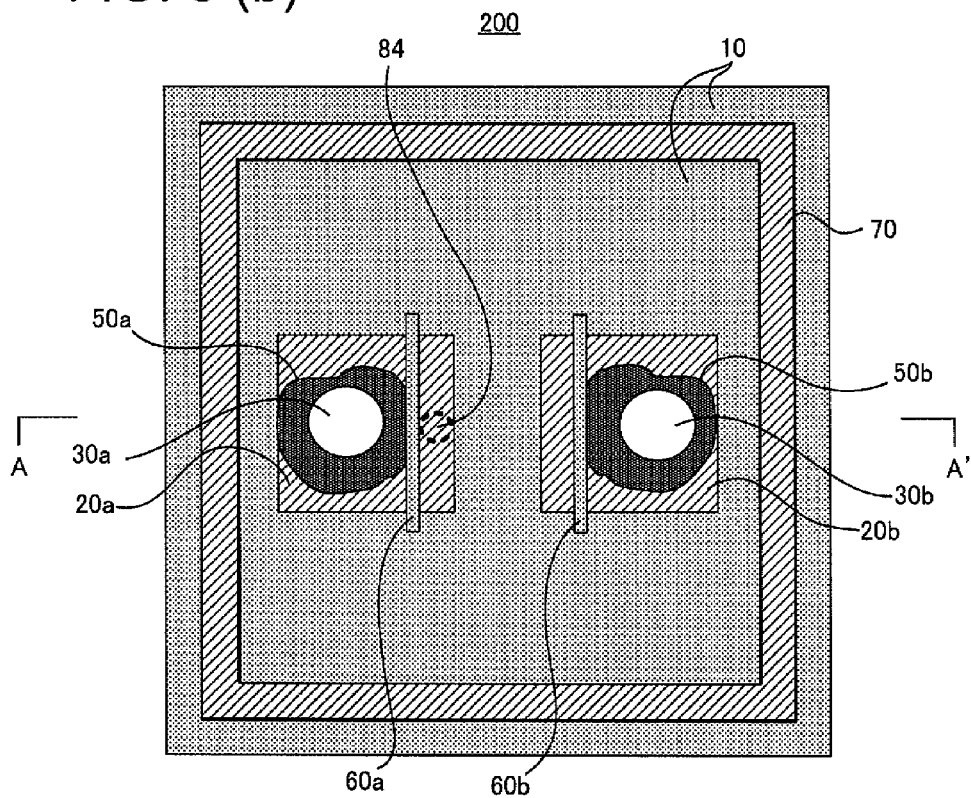

The above-described metallized ceramics substrate 100 of the present invention can be used as a package 200 for mounting semiconductor device 80. FIG. 3(*a*) is a side cross sectional view of a package 200 of the invention taken along the line A-A' of FIG. 3(*b*); and FIG. 3(*b*) is a plan view showing a package 200. In the embodiment shown in the drawings, a pair of wiring patterns 20*a* and 20*b* respectively corresponding to the positive and negative electrodes of the semiconductor device 80 to be mounted are formed.

In the package 200 of the invention, in order to enhance the reliability of the semiconductor device 80 to be mounted, the semiconductor device 80 is covered by a lid member 90. So, in the metallized ceramics substrate 100 of the invention used for the package 200, a metal frame 70 is formed to join the lid member 90 to the ceramics substrate 100 for keeping airtightness. The metal frame 70 is configured to encircle the wiring patterns 20*a*, 20*b* of the metallized ceramics substrate 100 and comprises a metallized pattern formed to be electrically-insulated from the wiring patterns. The metal frame 70, same as the above method of forming the wiring pattern 20, can be formed by coating the conductive paste in a predetermined area on the ceramics body 10. On the surface of the metal frame 70 thus formed, it is preferable to join a frame body of which material is the same as that of the lead 30 for easier joint with the lid member 90 and of which shape is substantially the same as that of the metal frame 70. The frame body is preferably joined using solder or brazing alloy after giving plating on the surface of the metal frame 70. At a time of joint using brazing alloy, members to be joined are heated to a temperature more than melting point of the brazing alloy; hence, so as to reduce the number of heating steps, joint of the above frame body to the metal frame 70 and filling of electroconductive filler 50 (joint of the lead 30 and the wiring pattern 20) are preferably carried out, simultaneously.

The metal frame 70, as shown in FIG. 3(*a*), is used for joining with the lid member 90. For example, when the substrate of this invention is used as a package for storing LED, as the lid member 90, a lens is used. At the edge of the lid member 90, a metal part 92 is formed for joint to the metal frame 70, this metal part 92 and the metal frame 70 are joined each other using, e.g., solder and brazing alloy to fabricate an electronic component.

The position for mounting the semiconductor device 80 is not particularly restricted as long as it is located within the metal frame 70 and on the wiring pattern 20 of the package 200. In the illustrated embodiment, the semiconductor device 80 is placed on one of the wiring patterns 20a and connected with the neighboring wiring pattern 20b by wire bonding 82.

EXAMPLES

Hereinafter, the invention will be described by way of examples. However, it does not mean that the invention is restricted by these examples.

Example 1

First of all, a plane substrate comprising an aluminum nitride sintered ceramics substrate obtained by sintering aluminum nitride powder of which average particle diameter is 1.5 μm with addition of yttrium oxide as sintering aides was prepared, wherein size of the aluminum nitride sintered-ceramics substrate is 5 centimeters square by 0.6 mm thick. Then, 50 through-holes of which diameter is 1.0 mm were formed therein by laser machining. Thereafter, 100 parts by mass of tungsten of which average particle diameter is 0.8 μm, 4 parts by mass of aluminum nitride powder of which average particle diameter is 1.5 μm, 0.2 parts by mass of yttrium oxide, 2 parts by mass of ethylcellulose, 13 parts by mass of terpineol, and 1 part by mass of dispersant were kneaded so as to make a conductive paste of which viscosity at 25° C. is adjusted to be 110 Pa·s. Later, by using this conductive paste, a wiring pattern 20 (including the metal layer on the surface of the inner wall of through-holes) shown in FIGS. 3(a), 3(b) and a pattern to be the metal frame 70 were formed in a five-by-five matrix (total 25 pieces) by screen printing, and drying was carried out at 100° C. for 5 minutes. Thickness of the post-drying film was 10 μm.

Next, 100 parts by mass of aluminum nitride powder of which average particle diameter is 1.5 μm, 5 parts by mass of yttrium oxide powder of which average particle diameter is 0.5 μm, 5 parts by mass of ethylcellulose, and 29 parts by mass of terpineol were kneaded so as to make an aluminum nitride paste of which viscosity at 25° C. is adjusted to be 40 Pa·s. The paste was used for screen-printing and formed an aluminum nitride paste layer to be the outflow prevention member 60 as shown in FIGS. 3(a) and 3(b). Thickness of the post-drying film of the aluminum nitride paste layer was 30 μm.

A substrate thus obtained by the above method was fired at 1800° C. for four hours in nitrogen gas; then, a metallized substrate was obtained. About this obtained substrate, electroless Ni—B plating was given over the wiring pattern 20 and metal frame 70; the pin 30 (diameter of bar portion: 0.8 mm, diameter of head portion: 1.1 mm, total length of the pin: 10 mm) made of 42-alloy was inserted into the through-hole; the wiring pattern 20 and the pin 30 were brazed with silver solder (BAg-8); and the frame body (0.15 mm thick) made of 42-alloy was also brazed with silver solder on the metal frame 70. And, electroless Ni—P plating and electroless Au plating were formed in the entire area other than the ceramics part (the wiring pattern 20, the lead 30, the brazing alloy 50, and the frame body of 42-alloy). Further, the obtained substrate was cut into twenty-five of nine centimeters square test pieces.

After this, ten of the test piece were heated in the atmosphere at 320° C. for 10 minutes, and inspected the airtightness in accordance with MIL-STD-883C METHOD 1014.7 "measuring method of unsealed package" (test condition A4) by using He leak detector; the result about all the test pieces were $4.9 \times 10^{-9}$ Pa·m$^3$/s or less. Thus, even when a gilded kovar-made lid was soldered to the package having satisfactory airtightness in a condition of unsealed state with Au—Sn solder (heating at 320° C. for 10 minutes), and inspected the airtightness in accordance with MIL-STD-883C METHOD 1014.7 "measuring method of sealed package" (test condition A1) by using He leak detector; airtightness was $4.9 \times 10^{-9}$ Pa·m$^3$/s or less. Therefore, hereinafter, all the airtightness tests were carried out in a condition where the package was unsealed. In addition, resistance determined from the lower portion of the lead 30 of back side of the ceramics body 10 to the semiconductor device mounting position 84 by four-probe method was 10 mΩ.

Example 2

Same as Example 1, a pierced plane substrate was prepared. Then, by using two types of conductive paste, a pattern to be the wiring pattern 20 consisting of a lower layer and a middle layer was formed. The lower layer was formed by kneading 100 parts by mass of tungsten of which average particle diameter is 2.3 μm, 16 parts by mass of aluminum nitride powder of which average particle diameter is 1.5 μm, 1 part by mass of yttrium oxide, 4 parts by mass of ethylcellulose, 21 parts by mass of terpineol, and 1 part by mass of dispersant, adjusting the kneaded material to be a conductive paste of which viscosity at 25° C. is 100 Pa·s and printing; meanwhile, the middle layer was formed by kneading 100 parts by mass of tungsten of which average particle diameter is 2.3 μm, 2 parts by mass of ethylcellulose, 11 parts by mass of terpineol, and 1 part by mass of dispersant, adjusting the kneaded material to be a conductive paste of which viscosity at 25° C. is 80 Pa·s and printing. After that, test pieces were made in the same manner as Example 1. On the fired substrate, electroless Ni—B plating was given; this is corresponding to the upper layer of the wiring pattern 20. When airtightness was checked about the test pieces, airtightness of all the test pieces were $4.9 \times 10^{-9}$ Pa·m$^3$/s or less. Further, resistance determined from the lower portion of the lead 30 of back side of the ceramics body 10 to the semiconductor device mounting position 84 by four-probe method was 10 mΩ.

Comparative Example 1

An aluminum nitride green sheet having a thickness of 0.7 mm and containing aluminum nitride powder of which average particle diameter is 1.5 μm and yttrium oxide as sintering aids was formed by doctor-blade method. Fifty through-holes of which diameter is 1.2 mm were made in the green sheet by punching; inside the through-holes, a conductive paste containing: 100 parts by mass of tungsten powder of which average particle diameter is 2.5 μm, and 3 parts by mass of aluminum nitride powder of which average particle diameter is 1.5 μm were completely filled; finally, on top of that, using similar conductive paste, the wiring pattern 20 and the metal frame 70 as shown in FIGS. 3(a) and 3(b) were printed and dried. Thickness of the post-dried film was 10 μm.

Later, the aluminum nitride paste layer 60 was formed in the same manner as Examples. Thickness of the post-dried film was 30 μm. Thereafter, degreasing was carried out in hydrogen containing water, and fired at 1800° C. to obtain a metallized substrate.

When electroless Ni—B plating was completed over the wiring pattern 20 and the metal frame 70 of the obtained substrate, brazing of pin 30 (diameter of bar portion: 0.8 mm, diameter of head portion: 1.1 mm, total length of the pin: 10 mm) of 42-alloy to the via hole on the back side of the substrate was done with silver solder. And, frame body (thickness 0.15 mm) of 42-alloy was brazed over the metal frame 70 with silver solder. Further, electroless Ni—P plating and electroless Au plating were formed in the entire area other than the ceramics part (the wiring pattern 20, the lead 30, and the frame body of 42-alloy). The obtained substrate was cut into twenty-five of nine centimeters square test pieces.

When checking the airtightness in the same manner as Example 1, the airtightness was $1 \times 10^{-8}$ to $100 \times 10^{-8}$ Pa·m³/s, which is not sufficient. Moreover, resistance determined from a the lower portion of the lead 30 of back side of the ceramics body 10 to the semiconductor device mounting position 84 by four-probe method was 12 mΩ.

Comparative Example 2

Except for filling the through-holes using a conductive paste containing 100 parts by mass of tungsten powder of which average particle diameter is 2.3 μm and 16 parts by mass of aluminum nitride powder of which average particle diameter is 1.5 μm, and then forming the wiring pattern 20 and the metal frame 70, Comparative example 2 was carried out in the same manner as the Comparative example 1 to make test pieces.

When checking the airtightness in the same manner as Example 1, the airtightness was all $4.9 \times 10^{-9}$ Pa·m³/s or less. Moreover, resistance determined from the lower portion of the lead 30 of back side of the ceramics body 10 to the semiconductor device mounting position 84 by four-probe method was 20 mΩ.

The above has described the present invention associated with the most practical and preferred embodiments thereof. However, the invention is not limited to the embodiments disclosed in the specification. Thus, the invention can be appropriately varied as long as the variation is not contrary to the subject substance and conception of the invention which can be read out from the claims and the whole contents of the specification. It should be understood that lead-embedded metallized ceramics substrate, and package with such an alternation are included in the technical scope of the invention.

INDUSTRIAL APPLICABILITY

The metallized ceramics substrate of the present invention can be used as a substrate for mounting a semiconductor device such as LD elements and LED elements.

The invention claimed is:

1. A metallized ceramics substrate comprising: a ceramics body; a wiring pattern formed on one surface of said ceramics body; a lead electrically-connected to said wiring pattern; and an outflow prevention member on said wiring pattern,
wherein said ceramics body has a through-hole,
said lead penetrates said through-hole and sticks out from another surface of said ceramics body,
said lead is fixed by filling an electroconductive filler between said lead and said through-hole, so that airtightness is kept,
said outflow prevention member is provided as a protrusion on said wiring pattern and limits the area to fill said electroconductive filler, and said wiring pattern has a triple-layer structure comprising: a lower layer; a middle layer; and an upper layer,
Wherein said lower layer is formed by coating a conductive paste containing ceramics powder, said middle layer is formed by coating a conductive paste which does not contain ceramics powder, and said upper layer is formed by plating.

2. The metallized ceramics substrate according to claim 1, wherein a metal frame comprising a metallized pattern being electrically-insulated with said wiring pattern and being configured to enclose said wiring pattern is provided on one surface of said ceramics body where said wiring pattern electrically-connected with said lead is formed.

3. The metallized ceramics substrate according to claim 1 or 2, wherein said lead is a metal pin, wherein said metal pin connects to said wiring pattern in one end thereof and penetrates said through-hole, and another end of said metal pin sticks out from another surface of said ceramics body.

4. The metallized ceramics substrate according to claim 3, wherein a hook portion is formed at one end of said metal pin for preventing its dropping out.

5. The metallized ceramics substrate according to claim 1, wherein said electroconductive filler is brazing alloy.

6. A method for fabricating a metallized ceramics substrate according to claim 1, the method comprising the steps of:
forming through-hole in a ceramics body;
forming a wiring pattern on one surface of said ceramics body by coating a conductive paste and firing thereof, and providing an outflow prevention member thereon in a convex manner for limiting the area to fill an electroconductive filler;
inserting a lead into said through-hole, connecting one end of said leads to said wiring pattern, and sticking another end of said lead out from another surface of said ceramics body to make it work as an external terminal; and
filling a filler in a gap between said lead and said through-hole.

7. A package for incorporating a semiconductor device comprising a metallized ceramics substrate described in claim 2 as a constitutional element.

* * * * *